United States Patent
Maeng et al.

[11] Patent Number: 5,861,327
[45] Date of Patent: Jan. 19, 1999

[54] FABRICATION METHOD OF GATE ELECTRODE IN SEMICONDUCTOR DEVICE

[75] Inventors: Sung-Jae Maeng; Jae-Jin Lee; Kwang-Eui Pyun, all of Daejeon, Rep. of Korea

[73] Assignee: Electronics and Telecommunications Research Institute, Daejeon, Rep. of Korea

[21] Appl. No.: 889,939

[22] Filed: Jul. 10, 1997

[30] Foreign Application Priority Data

Dec. 4, 1996 [KR] Rep. of Korea .................. 1996-61516

[51] Int. Cl.[6] .................................................. H01L 21/338
[52] U.S. Cl. ............................................ 438/167; 438/182
[58] Field of Search .................................. 438/167, 187, 438/182

[56] References Cited

U.S. PATENT DOCUMENTS 5,563,079 10/1996 Shin et al. ............................... 438/167

*Primary Examiner*—Brian Dutton
*Attorney, Agent, or Firm*—Jacobson, Price, Holman & Stern, PLLC

[57] ABSTRACT

A fabrication method of a semiconductor device is disclosed. A T-shaped gate used for decreasing the gate resistance is adopted in fabricating an ultrahigh frequency and low-noise device. According to the present invention, a gate pattern is formed by a dual exposure technique, a thin metal film is formed, a pattern for plating is formed, and a gate is formed by electroplating, whereby decreasing a gate length and gate resistance. Therefore, the cost of production is decreased, the yield is improved, and the noise figure is minimized.

3 Claims, 4 Drawing Sheets

FABRICATION METHOD OF GATE ELECTRODE IN SEMICONDUCTOR DEVICE

BACKGROUND OF THE INVENTION

1. Field of the Invention

The present invention relates to a fabrication method of semiconductor device, and more particularly, to a fabrication method of a gate electrode of a low-noise compound semiconductor device which is operated at the microwave or millimeter wave.

2. Description of the Conventional Art

Low-noise devices are used in low-noise amplifier for amplifying weak signals in the high-frequency radio communication. The noise properties can be quantificated into the noise figure (NF). Generally, the minimum noise figure $NF_{min}$ is expressed by the following formula:

$$NF_{min} \approx 1 + K_f W C_{gs} \left( \frac{R_g + R_s}{g_{m0}} \right)^{1/2}$$

It can be seen from the above formula that significant improvements in low-noise device performance can be made by reducing the gate length to 0.5 μm or less in order to reduce $C_{gs}$ and increasing the transconductance $g_{m0}$. But, it was difficult to reduce the noise figure when the gate length is reduced, because the gate resistance $R_g$ is increased according to the reduction of the gate length. And, it was difficult to form a gate having the gate length of 0.5 μm or less by using conventional photolithography technique.

In order to overcome the above-mentioned problem, it was known that a T-shaped gate having a T-shaped cross section is formed by using an electron beam lithography or dielectric materials.

The problems of the prior art will be described with reference to FIGS. 1 and 2.

FIG. 1 is a sectional view of T-shaped gate formed by a conventional E-beam lithography technique. First of all, a first photoresist film 104 is formed and a second photoresist film 106 having a degree of sensitivity to E-beam exposure corresponding to ten times or more of that of the first photoresist film 104 is deposited on the first photoresist film 104. Then, a third photoresist thin film 108, which is composed of the same material as the first photoresist film 104, is formed. When the resultant structure is exposed to E-beam and developed, a relatively wide opening is formed in the second photoresist film 106, and a relatively small opening is formed in the first photoresist film 104 corresponding to the size of the exposed region to E-beam, thereby resulting an opening shaped like a wine goblet. As a result of the development as above, The third photoresist thin film 108 has an opening having an opening size larger than that of the opening in the first photoresist film 104 and smaller than that of the opening in the second photoresist film 106, since the third photoresist thin film 108 suffers a loss at the edge portion during the development. Therefore, it is possible to perform lift-off process for removing unwanted metals but leaving a gate 107. After the patterning step as above, a metal film is formed and lift-off of the remaining metal is performed, thereby forming a T-shaped gate 107.

FIG. 2 is a sectional view of T-shaped gate formed by a conventional photolithography technique using dielectric materials. In this case, instead of the triple photoresist film used in the electron beam lithography technique as described above, a dielectric film 209 is used for defining a gate length. After defining the gate length, a pattern for lift-off having a width greater than the gate length is formed. A T-shaped gate 207 is formed by depositing a gate metal on the resultant structure and performing the lift-off process.

The conventional electron beam lithography technique described above has an advantage of obtaining a gate length of 0.5 μm or less. But, the T-shaped gate according to the conventional technique has a thickness not more than the thickness of the second photoresist film. Further, an expensive equipment is required in the conventional E-beam method while a low productivity is resulted from the conventional E-beam method. Thus, the conventional E-beam method has the problem of a high cost of the production.

The conventional technique using the dielectric materials has an advantage of forming the T-shaped gate by a simple process at a low cost. But, according to the conventional technique using the dielectric materials, the gate length is determined by the etched amount out of the dielectric film. And, a gate length of 0.5 μm or less can not be obtained by a usual photolithography. Further, the thickness of a metal film should be smaller than that of the photoresist film. Thus, the conventional technique using the dielectric materials is limited in decreasing the gate resistance.

SUMMARY OF THE INVENTION

It is an object of the present invention to provide a fabrication method of a gate electrode having a gate length of 0.5 μm or less and a thickness of the gate electrode larger than that of the gate electrode formed by a conventional method by three times or more in order to decrease the gate resistance by using a gold-plating process.

In accordance with the present invention, there is provided a method for fabricating a gate in a semiconductor device, which comprising the steps of forming a source and a drain in a selected region of an epitaxial structure substrate; exposing a first region including a gate region between the source and drain to a light after a first photoresist film is formed on the substrate; exposing a second region of the first photoresist film including the gate region to the light; forming a gate pattern by developing the exposed regions; forming a metal thin film on the resultant structure including the gate pattern; coating a second photoresist film on the metal thin film and removing a selected portion to form a pattern for electroplating; forming a gate electrode by performing electroplating; and removing the second and first photoresist film.

BRIEF DESCRIPTION OF THE DRAWINGS

The above and other objects and features of the present invention will become apparent from the following description of preferred embodiments, when taken in conjunction with the accompanying drawings, in which.

DETAILED DESCRIPTION OF THE PREFERRED EMBODIMENTS

This invention will be described in further detail by way of example with reference to the accompanying drawings.

In the present invention, a gate pattern is defined by using a dual exposure technique which is derived from a conventional photolithography method, instead of using an electron beam lithography or dielectric materials. Thereafter, a metal thin film is deposited before a plating pattern is formed. And then, a T-shaped gate is formed by using an electroplating process instead of the deposition of the metal film according to the conventional method.

Referring to the attached drawings, in FIGS. 3A to 3H, there is shown an example of the fabrication method of metal-semiconductor field effect transistors (MESFETs) or high electron mobility transistors (HEMTs).

Figure 1:
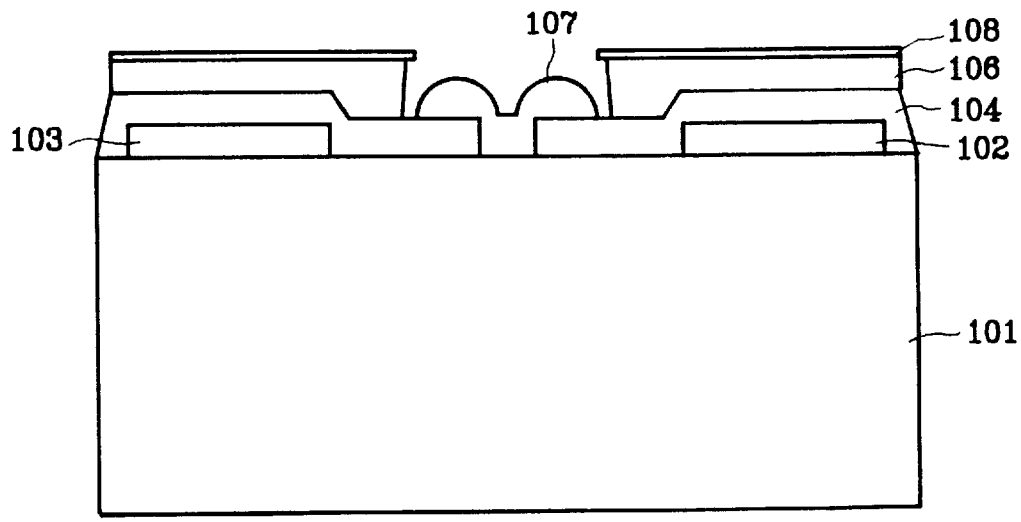
FIG. 1 shows a cross sectional view of a T-shaped gate formed by a conventional electron beam lithography technique.
Figure 2:
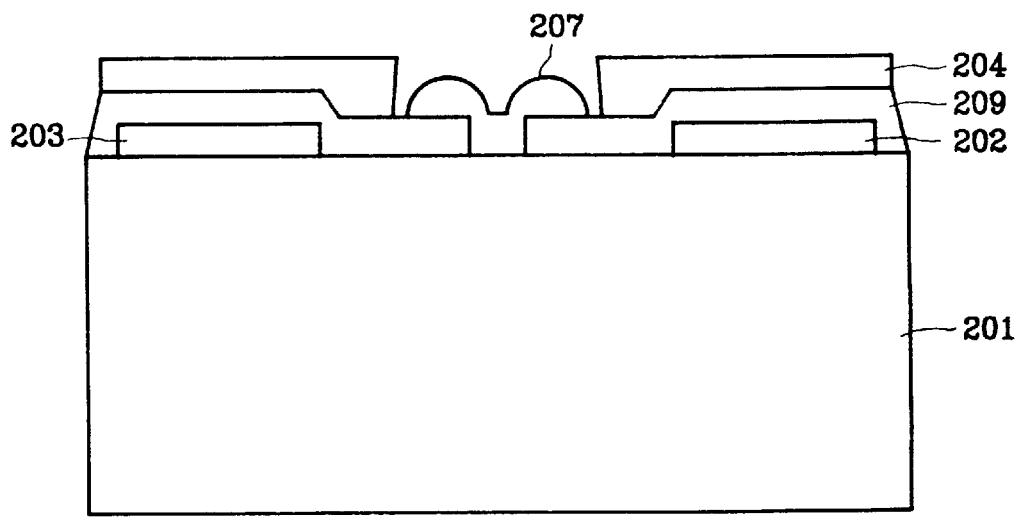
FIG. 2 shows a cross sectional view of a T-shaped gate formed by a conventional technique using dielectric materials.
Figure 3A:
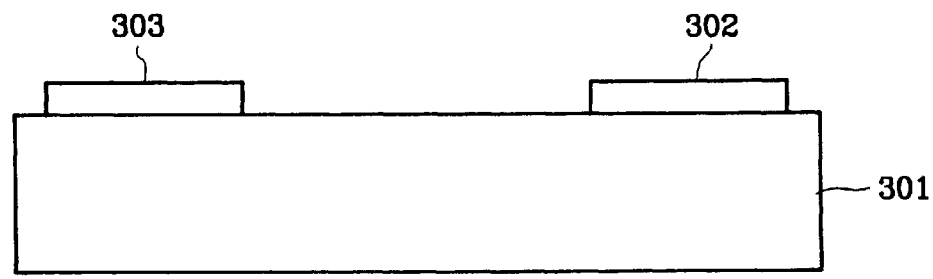
FIGS. 3A to 3H show cross sectional views of a developing structure for fabricating a T-shaped gate in the semiconductor device according to the present invention.

FIG. 3A shows a cross sectional view in which a source 303 and drain 304 are formed in a selected region of an epitaxial structure substrate 301.

Figure 3B:
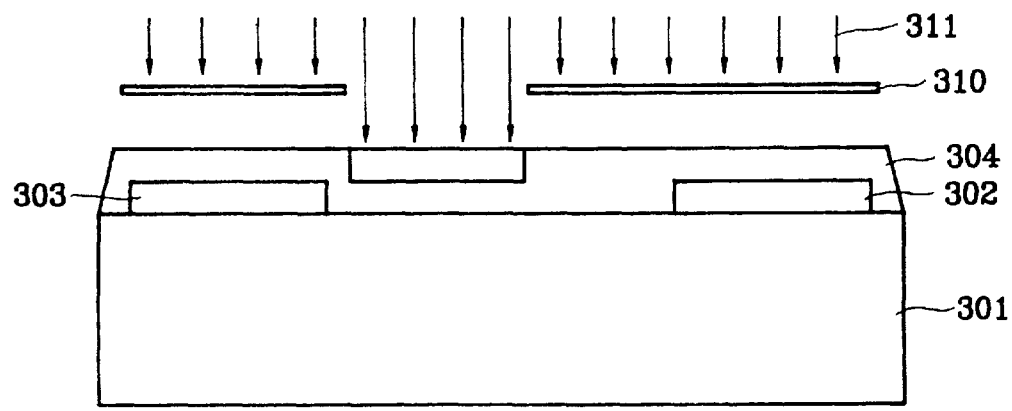

As shown in FIG. 3B, a first photoresist film 304 is deposited and a first region including a gate region between the source 303 and drain 302 is exposed to light 311 except the shadow region of the mask 310 by a photolithography apparatus, i.e. a stepper, in order to form a gate pattern. The exposure process is performed for a time corresponding to a half of the time required for a usual exposure process.

Figure 3C:
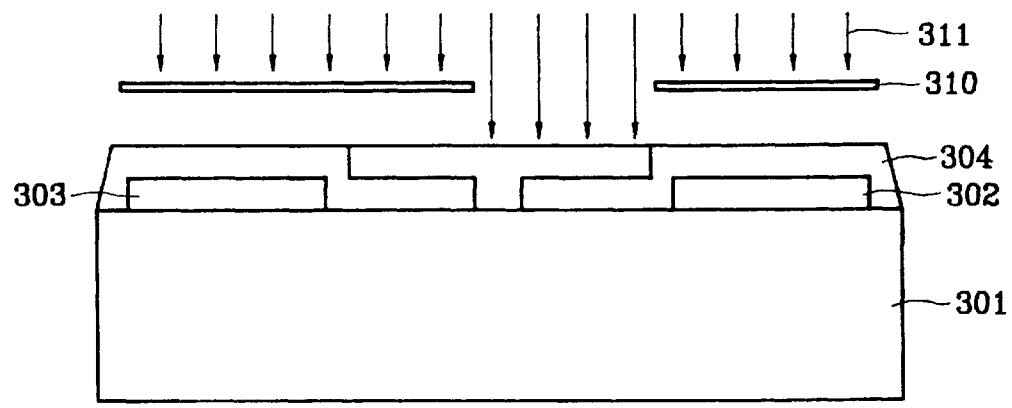

Referring to FIG. 3C, a stage of the stepper is moved so as to open a second region of the first photoresist film 304 including the gate region. And, the second region is exposed to the light 311 except the shadow region of the mask 310 for a time corresponding to a half of the time required for a usual exposure process. As a result, the gate region is completely exposed to the light as a usual case, and half of the thickness of the other exposed region is exposed to the light.

Figure 3D:
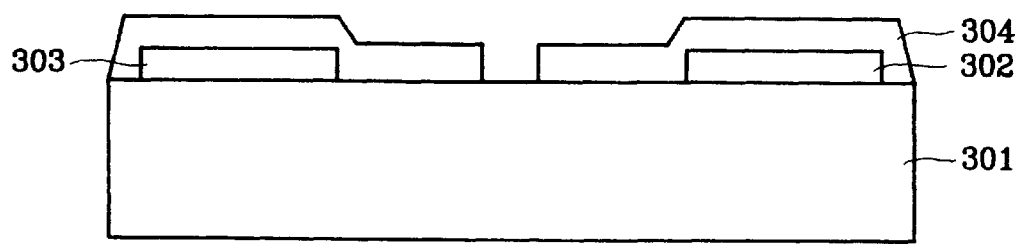

Referring to FIG. 3D, a gate pattern is formed by developing the exposed regions. In case that the movement of the stage does not have an accuracy tolerance of 0.1 $\mu$m or less or the alignment of the stage is inaccurate, two mask layers may be used.

Figure 3E:
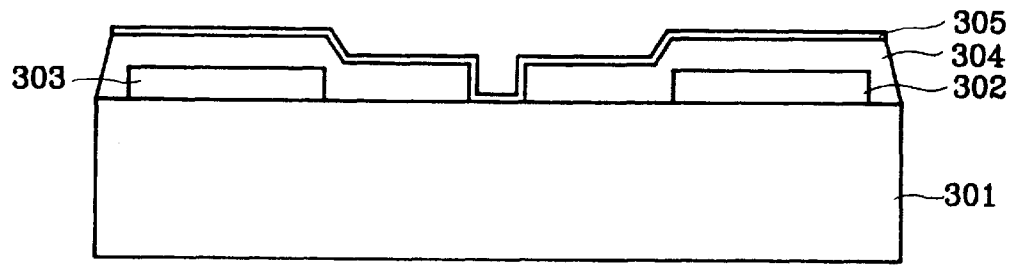

Referring to FIG. 3E, a metal thin film 305 having a thickness of 200 Å or less is formed by using an electron beam deposition device. The metal thin film 305 is formed of Ti/Au film. The metal thin film 305 serves as an electrode for electroplating and the Ti layer promotes the adhesion of the metal thin film 305 to the substrate.

Figure 3F:
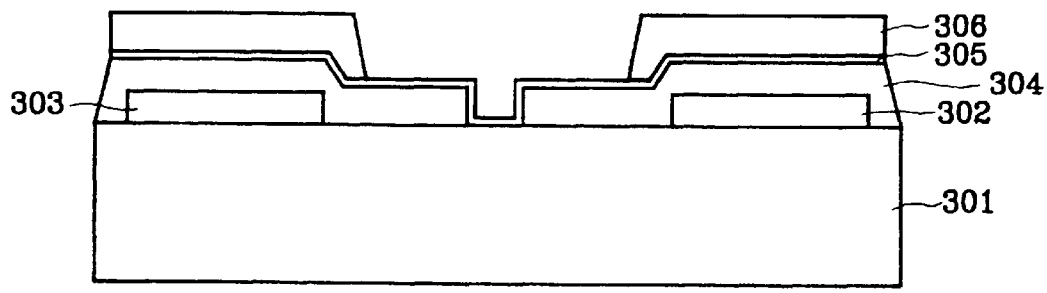

Referring to FIG. 3F, after a second photoresist film 306 is coated and baked, a portion on which gold is plated is exposed to the light and developed to form a pattern for electroplating.

Figure 3G:
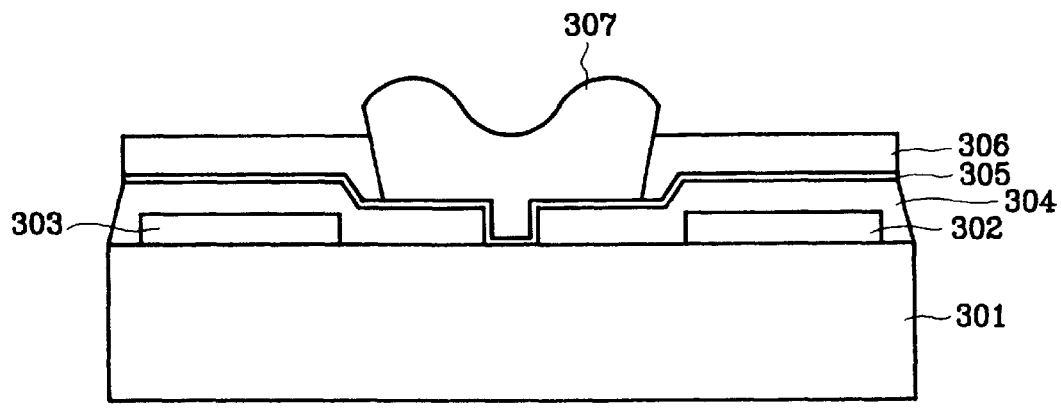

Referring to FIG. 3G, a gate 307 is formed by performing electroplating.

Figure 3H:
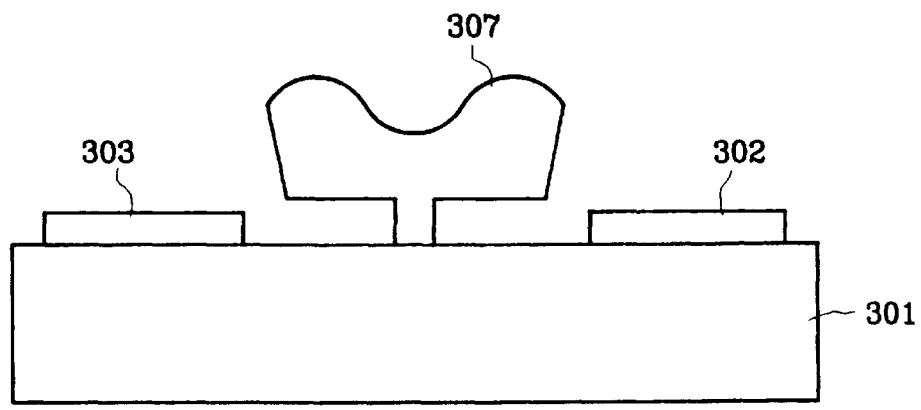

Referring to FIG. 3H, a T-shaped gate is formed by performing a lift-off process to remove the second photoresist film 306 and the first photoresist film 304, thereby forming a MESFET or HEMT device including the T-shaped gate.

As described above, a conventional photolithography process and gold-plating process are used in the present invention. Therefore, a gate pattern of 0.5 $\mu$m or less can be easily formed. And, the cost of production can be decreased and the yield can be improved. Further, the thickness of the gate metal film can be increased by three times or more in comparison with the conventional method. Therefore, the noise figure (NF) can be minimized.

While the present invention has been described with respect to certain preferred embodiments only, other modifications and variations may be made without departing from the scope of the present invention as set forth in the following claims.

What is claimed is:

1. A method for forming a gate in a semiconductor device, comprising the steps of:

forming a source and a drain on an epitaxial structure substrate;

exposing a first region including a gate region between the source and the drain to a light after a first photoresist film is formed on the substrate;

exposing a second region of the first photoresist film including the gate region to the light;

forming a gate pattern by developing the exposed first and second regions, thereby forming a resulting structure;

forming a metal film on the resulting structure including the gate pattern;

coating a second photoresist film on the metal film and patterning the second photoresist film;

forming a T-shaped gate by using an electroplating using the second photoresist pattern as a mask; and removing the second photoresist pattern and the first photoresist pattern.

2. The method of claim 1, wherein the metal film is formed to have a thickness of 200 Å or less.

3. The method of claim 1, wherein the T-shaped gate is defined by a dual exposure process and formed by said electroplating.

* * * * *